US012665385B2

(12) United States Patent　　(10) Patent No.: US 12,665,385 B2
Renard　　(45) Date of Patent: Jun. 23, 2026

(54) OPTICAL INTEGRATED CIRCUIT SENSOR PACKAGE USING A STACKED CONFIGURATION FOR THE SENSOR DIE AND THE EMITTER DIE

(71) Applicant: STMicroelectronics PTE LTD, Singapore (SG)

(72) Inventor: Loic Pierre Louis Renard, Singapore (SG)

(73) Assignee: STMicroelectronics PTE LTD, Singapore (SG)

( * ) Notice: Subject to any disclaimer, the term of this patent is extended or adjusted under 35 U.S.C. 154(b) by 932 days.

(21) Appl. No.: 17/712,932

(22) Filed: Apr. 4, 2022

(65) Prior Publication Data

US 2022/0368100 A1 Nov. 17, 2022

Related U.S. Application Data

(60) Provisional application No. 63/187,473, filed on May 12, 2021.

(51) Int. Cl.
| | |
|---|---|
| *H01S 5/026* | (2006.01) |
| *G02F 1/01* | (2006.01) |
| *H01S 5/00* | (2006.01) |
| *H01S 5/02218* | (2021.01) |
| *H01S 5/02253* | (2021.01) |

(Continued)

(52) U.S. Cl.
CPC .......... *H01S 5/0262* (2013.01); *G02F 1/0136* (2013.01); *H01S 5/0071* (2013.01); *H01S 5/02218* (2021.01); *H01S 5/02253* (2021.01); *H01S 5/02255* (2021.01); *H01S 5/0239* (2021.01); *H01S 5/18302* (2013.01)

(58) Field of Classification Search
CPC ............................. H01S 5/0262; H01S 5/0265
USPC ........................................................ 372/109
See application file for complete search history.

(56) References Cited

U.S. PATENT DOCUMENTS

| | | | |
|---|---|---|---|
| 5,838,703 | A | 11/1998 | Lebby et al. |
| 6,864,509 | B2 | 3/2005 | Worley |

(Continued)

FOREIGN PATENT DOCUMENTS

| | | |
|---|---|---|
| CN | 101740591 A | 6/2010 |
| CN | 101930312 A | 12/2010 |

(Continued)

OTHER PUBLICATIONS

Kim, DoHyeong, et al: "Optimization and Challenges on TSV MEOL Integration," Conference Paper, May 2014.

(Continued)

*Primary Examiner* — Minsun O Harvey
(74) *Attorney, Agent, or Firm* — Crowe & Dunlevy LLC

(57) ABSTRACT

An optical sensor package includes an emitter die mounted to an upper surface of a package substrate. A sensor die is mounted to the upper surface of the package substrate using a film on die (FOD) adhesive layer that extends over the upper surface and encapsulates the emitter die. The sensor die is positioned in a stacked relationship with respect to the emitter die such that a light channel region which extends through the sensor die is optically aligned with the emitter die. Light emitted by the emitter die passes through the light channel region of the sensor die. The emitter die and the sensor die are each electrically coupled to the package substrate.

25 Claims, 2 Drawing Sheets

(51) Int. Cl.

| | |
|---|---|
| *H01S 5/02255* | (2021.01) |
| *H01S 5/0239* | (2021.01) |
| *H01S 5/183* | (2006.01) |

(56) References Cited

U.S. PATENT DOCUMENTS

| | | | |
|---|---|---|---|
| 8,072,849 | B2 | 12/2011 | Hanaoka et al. |
| 8,143,608 | B2 | 3/2012 | Yao et al. |
| 8,193,555 | B2 | 6/2012 | Lin et al. |
| 9,589,941 | B1 | 3/2017 | Chen et al. |
| 9,684,074 | B2 | 6/2017 | Schrank et al. |
| 9,825,425 | B2 | 11/2017 | Mor |
| 10,203,398 | B2 | 2/2019 | Chen |
| 10,549,985 | B2 | 2/2020 | Maier et al. |
| 10,872,848 | B2 | 12/2020 | Yong et al. |
| 2009/0218588 | A1 | 9/2009 | Panaccione et al. |
| 2013/0016494 | A1 | 1/2013 | Speier et al. |
| 2013/0079068 | A1* | 3/2013 | Coffy et al. ............ H01L 27/14 |
| | | | 250/216 |
| 2016/0079500 | A1 | 3/2016 | Aoki et al. |
| 2016/0141440 | A1* | 5/2016 | Chun ...................... H10F 71/00 |
| | | | 257/82 |
| 2016/0276314 | A1 | 9/2016 | Ching et al. |
| 2017/0110416 | A1 | 4/2017 | Miao et al. |
| 2017/0350981 | A1 | 12/2017 | Halliday |
| 2018/0006182 | A1* | 1/2018 | Renard ................... H01G 9/20 |
| 2018/0337111 | A1* | 11/2018 | Jou ...................... G02B 6/4214 |
| 2019/0123109 | A1 | 4/2019 | Xie et al. |
| 2019/0355659 | A1 | 11/2019 | O'Sullivan et al. |

| | | | |
|---|---|---|---|
| 2020/0278426 | A1 | 9/2020 | Dummer et al. |
| 2020/0303346 | A1 | 9/2020 | Tsukiyama et al. |
| 2021/0080547 | A1 | 3/2021 | Luan |

FOREIGN PATENT DOCUMENTS

| | | | |
|---|---|---|---|
| CN | 105185800 | A | 12/2015 |
| CN | 205376527 | U | 7/2016 |
| CN | 106601727 | A | 4/2017 |
| CN | 107564924 | A | 1/2018 |
| CN | 110419108 | A | 11/2019 |
| CN | 218334709 | U | 1/2023 |
| EP | 3772088 | A2 | 2/2021 |
| FR | 3100378 | A1 | 3/2021 |
| KR | 20020078096 | A | 10/2002 |
| WO | 2019132958 | A1 | 7/2019 |
| WO | 2020136903 | A1 | 7/2020 |

OTHER PUBLICATIONS

CN First Office Action and Search Report for counterpart CN Appl. No. 202210507109.9, report dated May 24, 2025, 8 pgs.

CN Second Office Action for counterpart CN Appl. No. 202210507109.9, report dated Dec. 22, 2025, 8 pgs.

CN Third Office Action and Search Report for counterpart, CN Appl. No. 202210507109.9, report dated Mar. 13, 2026, 6 pgs.

Menglong Li, et al.: "Novel Electronic Packaging Method for Functional Electronic Textiles," Feb. 15, 2019, IEEE Transactions On Components Packaging and Manufacturing Technology, 11 pgs.

Zhangjin, et al.: "Laser Technology," Jun. 25, 2007, 5 pgs.

* cited by examiner

OPTICAL INTEGRATED CIRCUIT SENSOR PACKAGE USING A STACKED CONFIGURATION FOR THE SENSOR DIE AND THE EMITTER DIE

CROSS REFERENCE TO RELATED APPLICATION

This application claims priority from United States Provisional Application for Patent No. 63/187,473 filed May 12, 2021, the disclosure of which is incorporated herein by reference.

TECHNICAL FIELD

Embodiments relate to an optical integrated circuit sensor package which includes both a sensor die and an emitter die.

BACKGROUND

Reference is made to FIG. 1 which shows a cross-section of an optical integrated circuit sensor package 10. The package includes a package substrate 12, for example in the form of a leadframe, having an upper surface to which a sensor die 14 and an emitter die 16 are mounted. Any suitable die attachment mechanism as known by those skilled in the art may be employed to mount the sensor die 14 and emitter die 16 to the package substrate 12. Bonding wires 18 are used to electrically connect pads (not explicitly shown) at a front face of the die to conductor portions of the package substrate 12 (for example, leads of the leadframe). The sensor die 14 includes a first photosensitive region 20 and a second photosensitive region 22 at a front face of the die. The photosensitive regions 20 and 22 may, for example, each be formed by one or more single photon avalanche diode (SPAD) devices. The emitter die 16 includes a light emission region 24 at a front face of the die. The emitter die 16 may, for example, comprise a vertical cavity surface emitting laser (VCSEL) diode which is configured to emit light perpendicularly from the front face of the die. In an embodiment, this light may have any suitable wavelength for a desired sensing application but is preferably emitted in the infrared or near infrared range.

A cap 30 is mounted to the package substrate 12. The cap 30 includes a peripheral outer wall 32 and a front wall (or ceiling) 34, which define a cavity, and an interior wall 36 extending between opposite sides of the peripheral outer wall 32 which splits the cavity into a first cavity region 38 and a second cavity region 40. Distal end edges of the peripheral outer wall 32 are mounted to the upper surface of the package substrate 12 using a suitable adhesive material so as to enclose the sensor die 14 and emitter die 16 within the cavity of the cap 30 (more specifically with the sensor die 14 partially within each of the first and second cavity regions and the emitter die 16 solely within the first cavity region). The interior wall 36 is positioned between the first photosensitive region 20 and the second photosensitive region 22, and sealed by an adhesive to the front face of the sensor die 14, to form a light barrier that prevents light emitted by the light emission region 24 of the emitter die 16 within the first cavity region 38 from reaching the second photosensitive region 22 within the second region 40 by passing within the cavity of the cap 30. This light barrier, however, does not prohibit such emitted light within the first cavity region 38 from reaching the first photosensitive region 20.

The front wall (or ceiling) 34 of the cap 30 includes a first opening 42 optically aligned with the location of the light emission region 24 for the emitter die 16. An optical element 44 is mounted at (or perhaps in) the first opening 42. The front wall (or ceiling) 34 of the cap 30 further includes a second opening 46 optically aligned with the location of the second photosensitive region 22 for the sensor die 14. An optical element 48 is mounted at (or perhaps in) the second opening 44. The optical elements 44 and 48 may be designed to include lens and/or filter structures as desired for the optical sensing application.

The optical integrated circuit sensor package 10 is particularly well-suited for use in proximity sensing or distance measuring applications using time-of-flight (ToF) techniques. A pulse of light 4 is emitted from the light emission region 24 of the emitter die 16, and this light emission event is detected (using reflected light path 6) by the first photosensitive region 20 of the sensor die 14 to provide an emission pulse time reference. The emitted light pulse 4 exits the package 10 through the optical element 44 and first opening 42 and is reflected from a target object (not explicitly shown) back towards the package. The reflected light pulse 8 passes through the optical element 48 and second opening 46 and is detected by the second photosensitive region 22 of the sensor die 14 to provide a reflected pulse time reference. The time taken for the light pulse to travel to the object and be reflected back and sensed (i.e., the difference between the reflected pulse time reference and the emission pulse time reference) may be used to determine the distance between the object and the package 10 based on the known speed of light.

A concern with optical integrated circuit sensor packages, like the package 10 of FIG. 1, which include multiple integrated circuit die and which must be designed in accordance with certain design spacing rules, and which must further include optical elements, is the overall size of the package (both in terms of occupied area in the X-Y plane and overall volume taking into consideration the thickness in the Z direction). It would particularly be an advantage if a reduction in occupied area and a simpler construction could be supported for an optical integrated circuit sensor package.

SUMMARY

In an embodiment, an optical sensor package comprises: a package substrate; an emitter die mounted to an upper surface of the package substrate; an adhesive layer extending over the upper surface and encapsulating the emitter die; a sensor die mounted to an upper surface of the adhesive layer in a stacked relationship where the sensor die is positioned to cover over the emitter die; said sensor die including a light channel region that extends through the sensor die and which is optically aligned with the emitter die such that light emitted by the emitter die passes through the light channel region of the sensor die; and electrical connections between the package substrate and each of the emitter die and the sensor die.

The sensor die may further include, for the light channel region, an integrated diffractive optical element configured to diffract said light passing through the light channel. This integrated diffractive optical element may comprise a passive element formed, for example, by a plurality of metal structures associated with one or more metallization layers of the sensor die. The integrated diffractive optical element may alternatively comprise an active element formed, for example, by a plasmonic device or a liquid crystal on silicon (LCOS) device.

In an embodiment of the active element, one of or more of: a selectively configurable diffractive effect, a selectively configurable shutter, a selectively controllable diffraction pattern, a selectively controllable polarization filter, and a selectively controllable lens, may be provided.

In an embodiment, the adhesive layer may be provided by a film on die (FOD) structure.

In an embodiment, an apparatus comprises: a substrate; a first integrated circuit die mounted to an upper surface of the substrate; an adhesive film layer extending over the upper surface and encapsulating the first integrated circuit die; a second integrated circuit die mounted to an upper surface of the adhesive film layer in a stacked relationship where the second integrated circuit die is positioned to cover over the first integrated circuit die; and electrical connections between the substrate and each of the first and second integrated circuit dies.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 2:
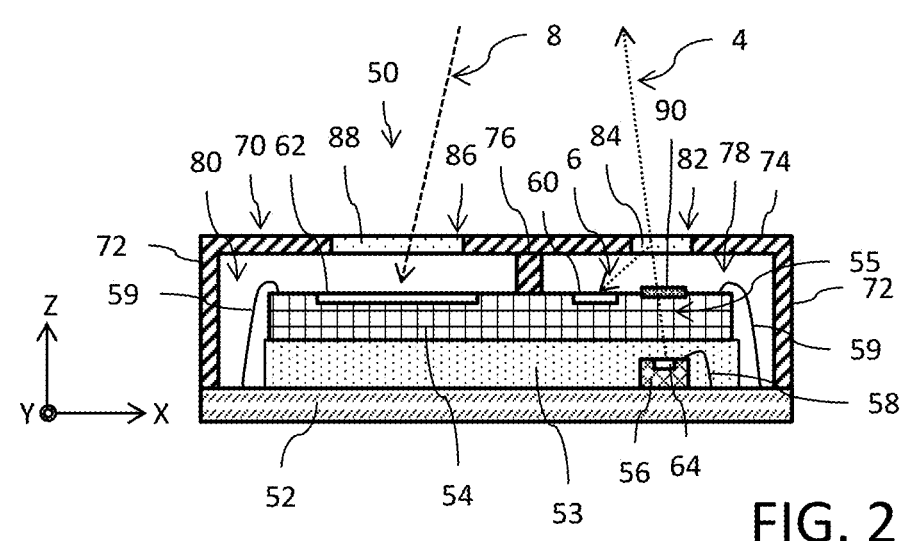
FIG. 2 is a cross-section of an optical integrated circuit sensor package.

Reference is made to FIG. 2 which shows a cross-section of an optical integrated circuit sensor package 50. The package includes a package substrate 52, for example in the form of a leadframe, having an upper surface to which an emitter die 56 is mounted. Any suitable die attachment mechanism as known by those skilled in the art may be employed to mount the emitter die 56 to the package substrate 52. The emitter die 56 includes a light emission region 64 at a front face of the die. The emitter die 56 may, for example, comprise a vertical cavity surface emitting laser (VCSEL) diode which is configured to emit light perpendicularly from the front face of the die. In an embodiment, this light may have any suitable wavelength, but is preferably emitted in the infrared or near infrared range. One or more bonding wires 58 are used to electrically connect pads (not explicitly shown) at a front face of the emitter die 56 to conductor portions of the package substrate 52 (for example, leads of the leadframe). A thick die attach film layer 53 extends in contact with the upper surface of the package substrate 52 and further encapsulates the emitter die 56 and its bonding wire(s) 58. This is referred to in the art as a "film on die" (FOD) structure. A sensor die 54 is mounted to the upper surface of the package substrate 52 using the thick die attach film layer 53. The sensor die 54 is positioned in a stacked relationship in the Z direction with respect to the emitter die 56 such that in the X-Y plane the sensor die 54 overlies (i.e., completely covers over) the emitter die 56. With this stacked die arrangement, light emitted by the light emission region 64 of the emitter die 56 (in the Z direction perpendicular to upper surface of the package substrate 52) will pass through an overlying portion of the film layer 53 and completely through the thickness of the sensor die 54 in a light channel region 55 that extends through the sensor die from its back surface to its front surface. This is possible because many of the materials (silicon, oxides, etc.) used in the manufacture of sensor die are transparent to the preferred infrared or near infrared light emitted by the emitter die 56. The light channel region 55 is optically aligned with the light emission region 64 of the emitter die 56. In an embodiment, the light channel region 55 may be partially delimited by a region of the semiconductor substrate of the sensor die 54 with a different, for example lower, native doping concentration than a remainder of the semiconductor substrate within which active semiconductor devices (such as analog and or digital circuits) are fabricated. In an embodiment, the light channel region 55 may be further partially delimited by a region of an overlying interconnect layer which is devoid of metal electrical connection lines and vias for electrically interconnecting integrated circuits of the sensor die. Bonding wires 59 are used to electrically connect pads (not explicitly shown) at a front face of the die 54 to conductor portions of the package substrate 52 (for example, leads of the leadframe). The integrated circuits of the sensor die 54 include a first photosensitive region 60 and a second photosensitive region 62 at a front face of the die. The photosensitive regions 60 and 62 may, for example, each be formed by one or more single photon avalanche diode (SPAD) devices integrated at and/or within the semiconductor substrate.

A cap 70 is mounted to the package substrate 52. The cap 70 includes a peripheral outer wall 72 and a front wall (or ceiling) 74, which define a cavity, and an interior wall 76 extending between opposite sides of the peripheral outer wall 72 which splits the cavity into a first cavity region 78 and a second cavity region 80. Distal end edges of the peripheral outer wall 72 are mounted to the upper surface of the package substrate 52 using a suitable adhesive material so as to enclose the sensor die 54 and emitter die 56 within the cavity of the cap 70 (more specifically with the sensor die 54 partially within each of the first and second cavity regions and the emitter die 56 solely within the first cavity region). The interior wall 76 is positioned between the first photosensitive region 60 and the second photosensitive region 62, and sealed by an adhesive to the front face of the sensor die 54, to form a light barrier that prevents light emitted by the light emission region 64 of the emitter die 56 (which passes through the channel region 55 and into the first cavity region 78) from reaching the second photosensitive region 62 within the second region 80 by passing within the cavity of the cap 70. This light barrier, however, does not prohibit such emitted light within the first cavity region 78 from reaching the first photosensitive region 60.

The front wall (or ceiling) 74 of the cap 70 includes a first opening 82 optically aligned with the location of both the channel region 55 and the light emission region 64 for the emitter die 56. An optical element 84 is mounted within the first opening 82. The front wall (or ceiling) 74 of the cap 70 further includes a second opening 86 optically aligned with the location of the second photosensitive region 62 for the sensor die 54. An optical element 88 is mounted within the second opening 84. The optical elements 84 and 88 are typically transparent glass structures but may also be designed to include lens and/or filter structures as desired for the optical sensing application.

Figure 3:
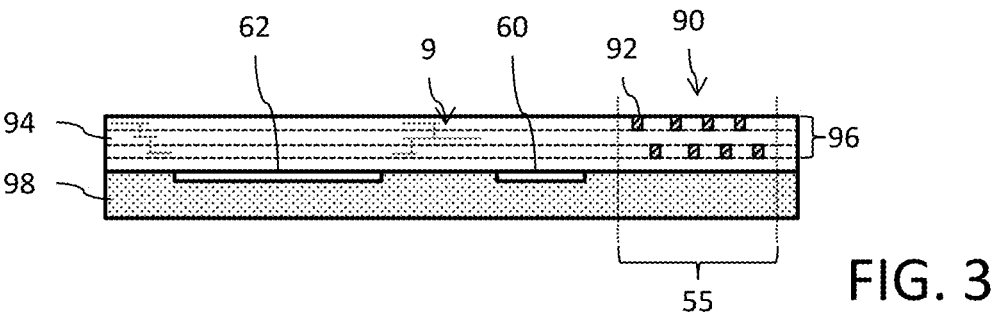
FIGS. 3-5 show details for an optical diffraction element integrated in the sensor die of the optical integrated circuit sensor package shown in FIG. 2.
Figure 4:
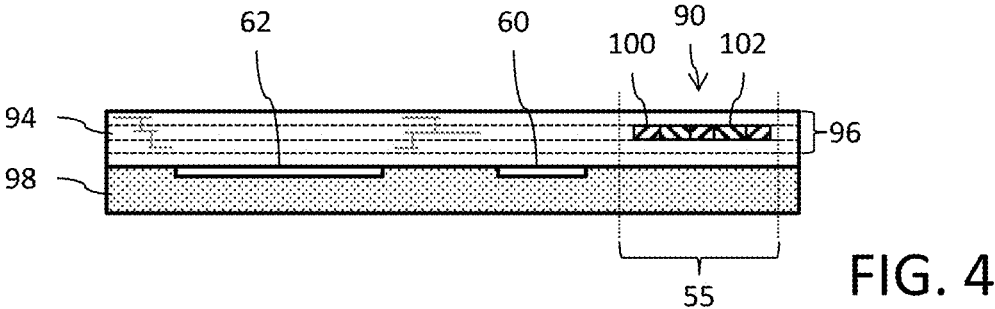
Figure 5:
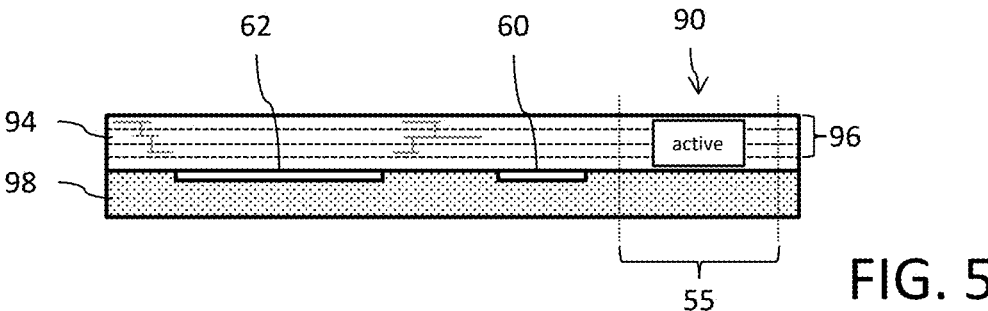

In addition to the first photosensitive region 60 and the second photosensitive region 62 which are integrated into the sensor die 54 at the front face, the sensor die further includes an integrated diffractive optical element (DOE) 90, for example located at or near the front face of the die and provided in connection with (e.g., as an integral part of) the light channel region 55. This integrated diffractive optical element 90 is optically aligned within the channel region 55 in the Z direction to the light emission region 64 of the emitter die 56, and is configured to diffract the light emitted from the light emission region 64 of the emitter die 56 and which passes through the channel region 55. In one embodiment, the integrated diffractive optical element 90 is a passive element provided in the form of a pattern of metal structures 92 (forming, for example, an optical grating). The metal structures 92 are formed by and in one or more of the metallization layers 94 of the interconnect layer 96 which extends over the top surface of the semiconductor substrate 98 of the sensor die 54 (see, FIG. 3)—it being understood by those skilled in the art that this interconnect layer further includes, in areas other than in the channel region 55, metal lines and vias (generally, reference 9) in the metallization layers 94 for electrically connecting integrated circuit devices. In another embodiment, the integrated diffractive optical element 90 is a passive element provided in the form of a pattern of transparent structures 100, 102 within the interconnect 96 that have different indices of refraction (see, FIG. 4). In yet another embodiment, the integrated diffractive optical element 90 is an active element provided in the form a plasmonic diffraction element or a liquid crystal on silicon (LCOS) diffraction element (see, FIG. 5). The active integrated diffractive optical element can be controlled by a control circuit located on the sensor die 54 (or provided externally and electrically coupled to the sensor die 54) to actively control the type of diffractive effect to be provided. For example, the active integrated diffractive optical element may be configured to provide a controllable shutter function to selectively block/pass the light emitted by the emitter die 56. As another example, the active integrated diffractive optical element may be configured to provide a controllable diffraction pattern (for example, through an adaptive control over one or more of: the number of openings, size of the openings, and separation between openings). In a further example, the active integrated diffractive optical element may be configured to provide a controllable polarization filter (for example, switching between polarization modes). In still another example, the active integrated diffractive optical element may be configured to provide a controllable lens (for example, for the purpose of controlling beam shape, focal point, field of view, etc., for the emitted pulse of light 4).

The optical integrated circuit sensor package 50 is particularly well-suited for use in proximity sensing or distance measuring applications using time-of-flight (ToF) techniques. A pulse of light 4 is emitted from the light emission region 64 of the emitter die 56 to pass through the channel region 55 and into the first cavity region 78. The emitted light pulse 4 is further (actively or passively) diffracted by the integrated diffractive optical element 90. This light emission event is detected (using reflected light path 6) by the first photosensitive region 60 of the sensor die 54 to provide an emission pulse time reference. The emitted and diffracted light pulse 4 exits the package 50 through the optical element 84 and first opening 82 and is reflected from a target object (not explicitly shown) back towards the package. The reflected light pulse 8 passes through the optical element 88 and second opening 86 and is detected by the second photosensitive region 62 of the sensor die 54 to provide a reflected pulse time reference. The time taken for the light pulse to travel to the object and be reflected back and sensed (i.e., the difference between the reflected pulse time reference and the emission pulse time reference) may be used to determine the distance between the object and the package 50 based on the known speed of light.

Figure 1:
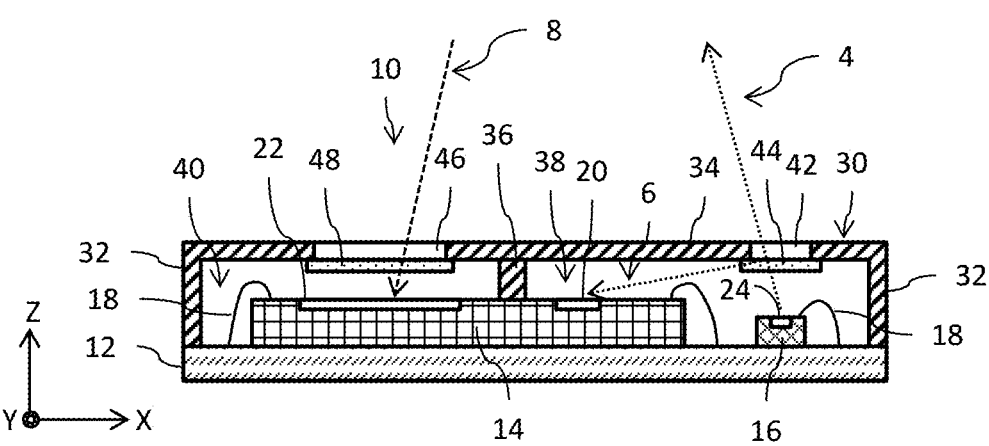
FIG. 1 is a cross-section of an optical integrated circuit sensor package.

An advantage of the package 50 of FIG. 2 over the package 10 of FIG. 1 is a reduction of occupied area in the X-Y plane at the expense of a relatively small thickness increase in Z-direction. A further advantage is that the functionality of the optical diffraction element 90, whether passive or active, is provided through the sensor die 54. This simplifies the construction and further reduces part count for the overall device.

The foregoing description has provided by way of exemplary and non-limiting examples of a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. An optical sensor package, comprising:
   a package substrate;
   an emitter die having a back surface mounted to an upper surface of the package substrate;
   an adhesive layer extending over the upper surface and encapsulating the emitter die on its side and front surfaces, wherein the adhesive layer includes a portion overlying the emitter die;
   a sensor die mounted to an upper surface of the adhesive layer in a stacked relationship where the sensor die is positioned to cover over the portion of the adhesive layer overlying the emitter die;
   said sensor die including a light channel region that extends through a thickness of the sensor die and which is optically aligned with the emitter die such that light emitted by the emitter die passes through the light channel region of the sensor die; and
   electrical connections between the package substrate and each of the emitter die and the sensor die.

2. The optical sensor package of claim 1, wherein the package substrate comprises a leadframe.

3. The optical sensor package of claim 1, wherein the emitter die is a vertical cavity surface emitting laser (VCSEL) diode and wherein the sensor die includes at least one photosensitive region.

4. The optical sensor package of claim 3, wherein the at least one photosensitive region comprises one or more single photon avalanche diode (SPAD) devices.

5. The optical sensor package of claim 1, wherein the sensor die includes, for the light channel region, an integrated diffractive optical element configured to diffract said light passing through the light channel.

6. The optical sensor package of claim 5, wherein the integrated diffractive optical element is a passive element formed by a pattern of transparent structures having different indices of refraction.

7. The optical sensor package of claim 5, wherein the integrated diffractive optical element is a passive element formed by a plurality of metal structures formed by and in one or more metallization layers of the sensor die.

8. The optical sensor package of claim 5, wherein the integrated diffractive optical element is an active element.

9. The optical sensor package of claim 8, wherein the active element is selected from the group consisting of: a plasmonic device, and a liquid crystal on silicon (LCOS) device.

10. The optical sensor package of claim 8, wherein the active element has an operating feature selected from the group consisting of: a selectively configurable diffractive effect, a selectively configurable shutter, a selectively controllable diffraction pattern, a selectively controllable polarization filter, and a selectively controllable lens.

11. The optical sensor package of claim 1, further including a cap including a peripheral wall and a front wall, said cap mounted to the package substrate, and wherein the front wall includes a first opening optically aligned with the light channel region of the sensor die and optically aligned with the emitter die.

12. The optical sensor package of claim 11, wherein the front wall of the cap further includes a second opening optically aligned with a photosensitive region of the sensor die.

13. The optical sensor package of claim 1, wherein the adhesive layer is a film on die (FOD) structure.

14. An optical sensor package, comprising:
a package substrate;
an emitter die mounted to an upper surface of the package substrate;
an adhesive layer extending over the upper surface and encapsulating the emitter die;
a sensor die mounted to an upper surface of the adhesive layer in a stacked relationship where the sensor die is positioned to cover over the emitter die;
said sensor die including a light channel region that extends through a thickness of the sensor die and which is optically aligned with the emitter die such that light emitted by the emitter die passes through the light channel region of the sensor die; and
electrical connections between the package substrate and each of the emitter die and the sensor die; and
wherein the sensor die includes a semiconductor substrate and wherein the light channel region is at least partially delimited by a region of the semiconductor substrate having a different native doping concentration level than another region within which active integrated circuits are fabricated.

15. An optical sensor package, comprising:
a package substrate;
an emitter die mounted to an upper surface of the package substrate;
an adhesive layer extending over the upper surface and encapsulating the emitter die;
a sensor die mounted to an upper surface of the adhesive layer in a stacked relationship where the sensor die is positioned to cover over the emitter die;
said sensor die including a light channel region that extends through a thickness of the sensor die and which is optically aligned with the emitter die such that light emitted by the emitter die passes through the light channel region of the sensor die; and
electrical connections between the package substrate and each of the emitter die and the sensor die;
wherein said sensor die comprises:
a semiconductor substrate; and
an interconnect layer extending over the semiconductor substrate; and
wherein the light channel region extends through a first portion of the semiconductor substrate and a first portion of the interconnect layer from a back side of the sensor die to a front side of the sensor die.

16. The optical sensor package of claim 15, wherein said semiconductor substrate further includes a second portion in which photosensitive circuits are formed, and wherein said first portion and said second portion of the semiconductor substrate have different native doping concentration levels.

17. The optical sensor package of claim 16, wherein said interconnect layer includes a second portion in which electrical interconnect lines and vias are formed, and wherein further comprising an integrated diffractive optical element within the first portion of the interconnect layer.

18. The optical sensor package of claim 17, wherein the integrated diffractive optical element is a passive element selected from the group consisting of: a pattern of transparent structures having different indices of refraction and a plurality of metal structures forming an optical grating.

19. The optical sensor package of claim 17, wherein the integrated diffractive optical element is an active element selected from the group consisting of: a plasmonic device and a liquid crystal on silicon (LCOS) device.

20. An apparatus, comprising:
a substrate;
a first integrated circuit die mounted to an upper surface of the substrate;
a film on die (FOD) structure providing a die attach film layer extending over the upper surface and completely encapsulating the first integrated circuit die;
a second integrated circuit die mounted to an upper surface of the FOD structure in a stacked relationship where the second integrated circuit die is positioned to cover over the first integrated circuit die; and
electrical connections between the substrate and each of the first and second integrated circuit dies.

21. The apparatus of claim 20, wherein said first integrated circuit die includes a light emitter configured to emit a beam of light that passes through a light channel region that extends through a thickness of the second integrated circuit die, and wherein the second integrated circuit die includes a light sensor configured to sense the emitter beam of light.

22. The apparatus of claim 21, wherein the second integrated circuit die includes, for the light channel region, an integrated diffractive optical element configured to diffract said beam of light passing through the light channel region.

23. The apparatus of claim 20, wherein the first integrated circuit die includes a light emission region and wherein the FOD structure covers the light emission region.

24. An apparatus, comprising:
a substrate;
a first integrated circuit die mounted to an upper surface of the substrate;
an adhesive film layer extending over the upper surface and encapsulating the first integrated circuit die;
a second integrated circuit die mounted to an upper surface of the adhesive film layer in a stacked relationship where the second integrated circuit die is positioned to cover over the first integrated circuit die; and
electrical connections between the substrate and each of the first and second integrated circuit dies;
wherein said first integrated circuit die includes a light emitter configured to emit a beam of light that passes through a light channel region that extends through a thickness of the second integrated circuit die, and wherein the second integrated circuit die includes a light sensor configured to sense the emitter beam of light; and
wherein said second integrated circuit die comprises:
a semiconductor substrate; and
an interconnect layer extending over the semiconductor substrate; and
wherein the light channel region extends through a first portion of the semiconductor substrate and a first portion of the interconnect layer from a back side of the second integrated circuit die to a front side of the second integrated circuit die.

25. The apparatus of claim 24, wherein the second integrated circuit die includes, for the light channel region, an integrated diffractive optical element configured to diffract said beam of light passing through the light channel region.

* * * * *